(12) United States Patent
Adusumilli

(10) Patent No.: US 7,877,566 B2
(45) Date of Patent: Jan. 25, 2011

(54) SIMULTANEOUS PIPELINED READ WITH MULTIPLE LEVEL CACHE FOR IMPROVED SYSTEM PERFORMANCE USING FLASH TECHNOLOGY

(75) Inventor: Vijaya P. Adusumilli, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 370 days.

(21) Appl. No.: 11/043,277

(22) Filed: Jan. 25, 2005

(65) Prior Publication Data

US 2006/0168418 A1 Jul. 27, 2006

(51) Int. Cl.
G06F 12/00 (2006.01)
G06F 13/00 (2006.01)
G06F 13/28 (2006.01)
G11C 7/10 (2006.01)
G11C 8/00 (2006.01)

(52) U.S. Cl. .................. 711/169; 711/103; 711/115; 711/117; 711/122; 711/127; 711/129; 711/140; 711/167; 711/168; 365/189.05; 365/230.03

(58) Field of Classification Search ......... 711/167–169, 711/102–3, 117–140, 142, 115, 102, 103; 365/189.05, 200, 222, 230.03
See application file for complete search history.

(56) References Cited

U.S. PATENT DOCUMENTS

| | | | | |
|---|---|---|---|---|
| 5,297,148 A * | 3/1994 | Harari et al. | ................. | 714/710 |
| 5,488,711 A * | 1/1996 | Hewitt et al. | ................. | 711/103 |
| 5,502,835 A * | 3/1996 | Le et al. | ...................... | 711/169 |
| 5,592,435 A * | 1/1997 | Mills et al. | ............... | 365/233.5 |
| 5,781,925 A | 7/1998 | Larson et al. | | |
| 5,784,705 A * | 7/1998 | Leung | .......................... | 711/169 |
| 6,263,398 B1 | 7/2001 | Taylor et al. | .................... | 711/3 |
| 6,374,337 B1 * | 4/2002 | Estakhri | ...................... | 711/169 |
| 6,415,362 B1 * | 7/2002 | Hardage et al. | ............. | 711/142 |
| 6,628,563 B1 | 9/2003 | Hsu et al. | | |
| 6,754,779 B1 | 6/2004 | Magro | ......................... | 711/137 |
| 7,073,016 B2 * | 7/2006 | Zitlaw | ......................... | 711/103 |
| 2003/0033471 A1 * | 2/2003 | Lin et al. | ..................... | 711/103 |
| 2003/0204675 A1 * | 10/2003 | Dover et al. | ................. | 711/137 |
| 2003/0206456 A1 | 11/2003 | Hsu et al. | | |
| 2004/0003174 A1 * | 1/2004 | Yamazaki | .................... | 711/118 |

(Continued)

FOREIGN PATENT DOCUMENTS

WO WO-2006081057 A3 8/2006

OTHER PUBLICATIONS

Website printout: Wireless Systems Design: The Tool for Architecting the Unwired World, "Memory Motivates Cell-Phone Growth", Apr. 2004, 8 pages.

(Continued)

*Primary Examiner*—Yaima Campos
(74) *Attorney, Agent, or Firm*—Schwegman, Lundberg & Woessner, P.A.

(57) ABSTRACT

A read command protocol and a method of accessing a non-volatile memory device having an internal cache memory. A memory device configured to accept a first and second read command, outputting a first requested data while simultaneously reading a second requested data. In addition, the memory device may be configured to send or receive a confirmation indicator.

29 Claims, 7 Drawing Sheets

U.S. PATENT DOCUMENTS

2004/0057316 A1    3/2004  Kozakai et al.
2005/0050231 A1*   3/2005  Williams ........................ 710/1
2006/0140043 A1*   6/2006  Roohparvar et al. ........ 365/232

OTHER PUBLICATIONS

"International Application Serial No. PCT/US2006/000564, Search Report mailed Sep. 25, 2007", 1 pg.

"International Application Serial No. PCT/US06/00564, International Preliminary Report on Patentability mailed Jun. 18, 2008", 7 pgs.

"International Application Serial No. PCT/US06/00564, Written Opinion mailed Sep. 27, 2007", 4 pgs.

* cited by examiner

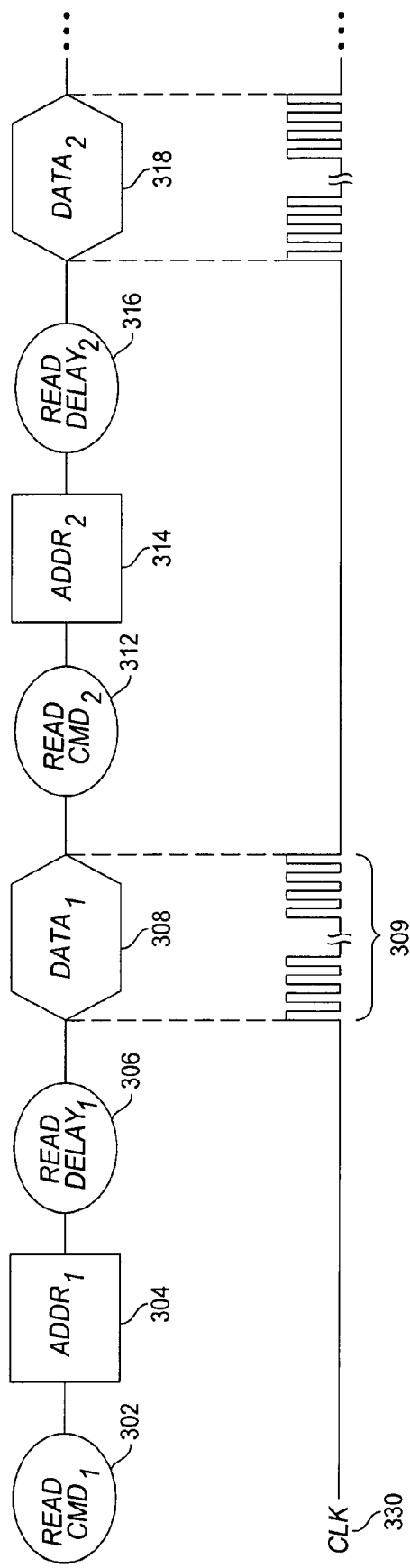
Fig._1 (Prior Art)

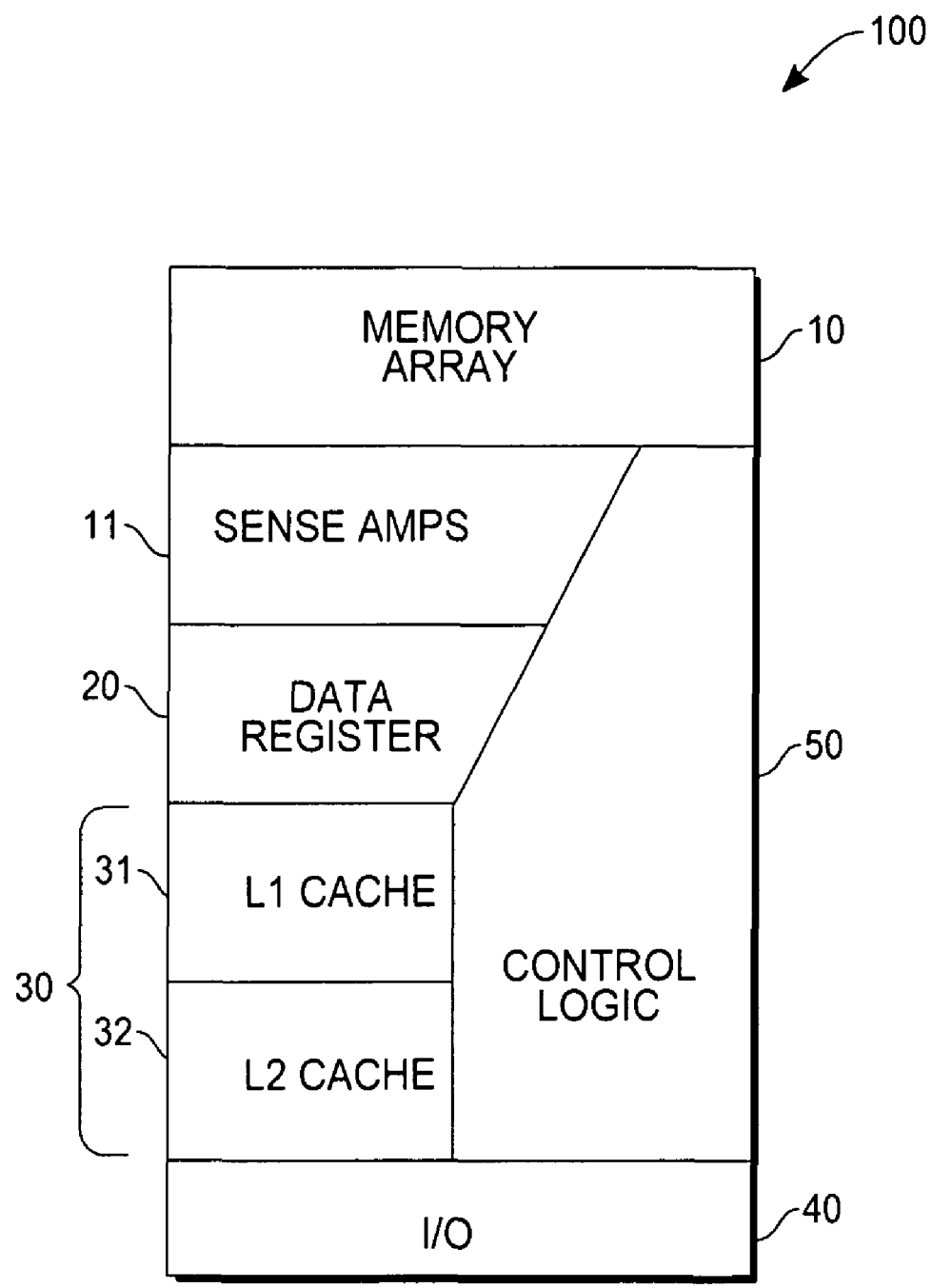
Fig._2

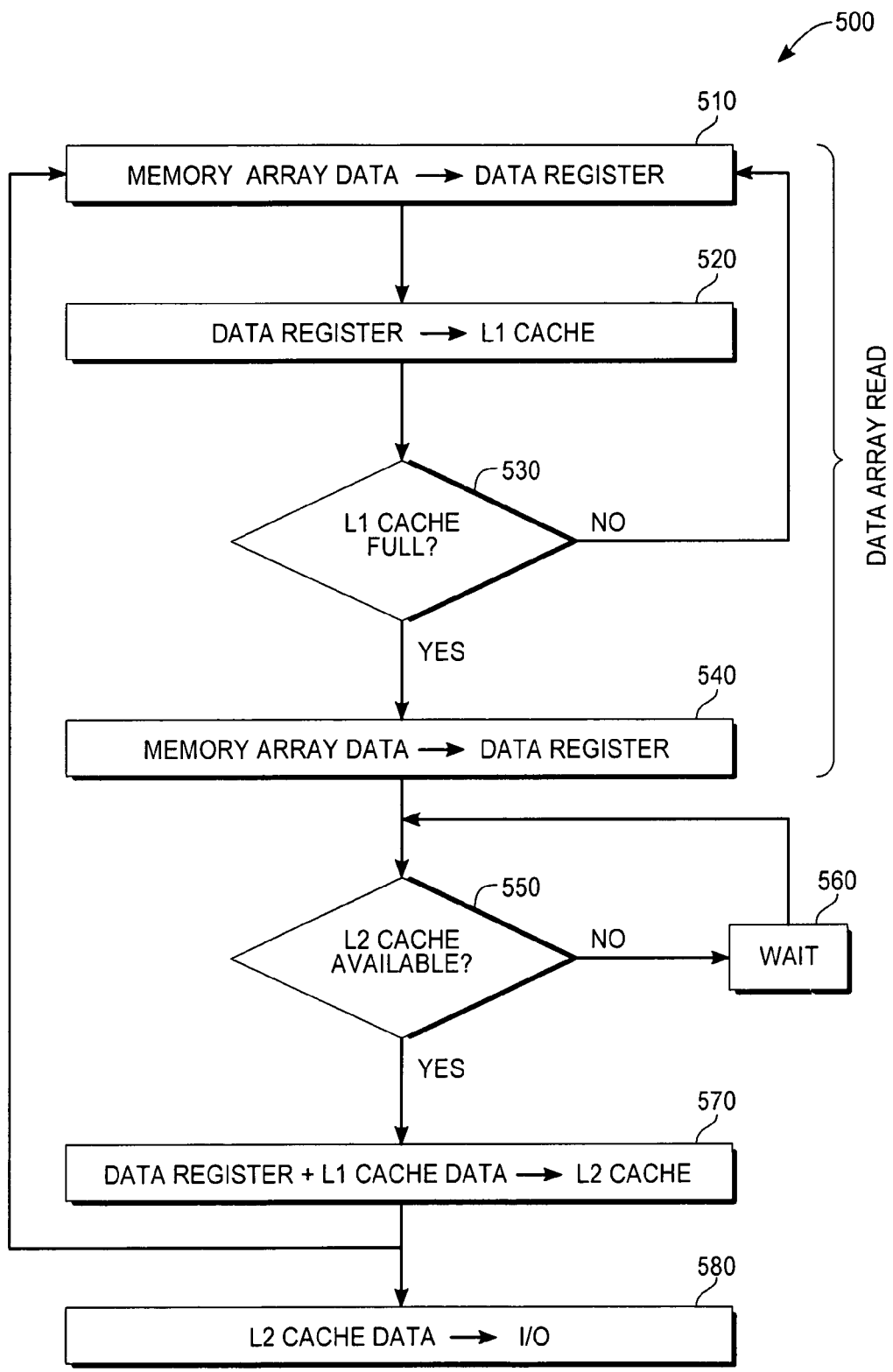
Fig. _3b

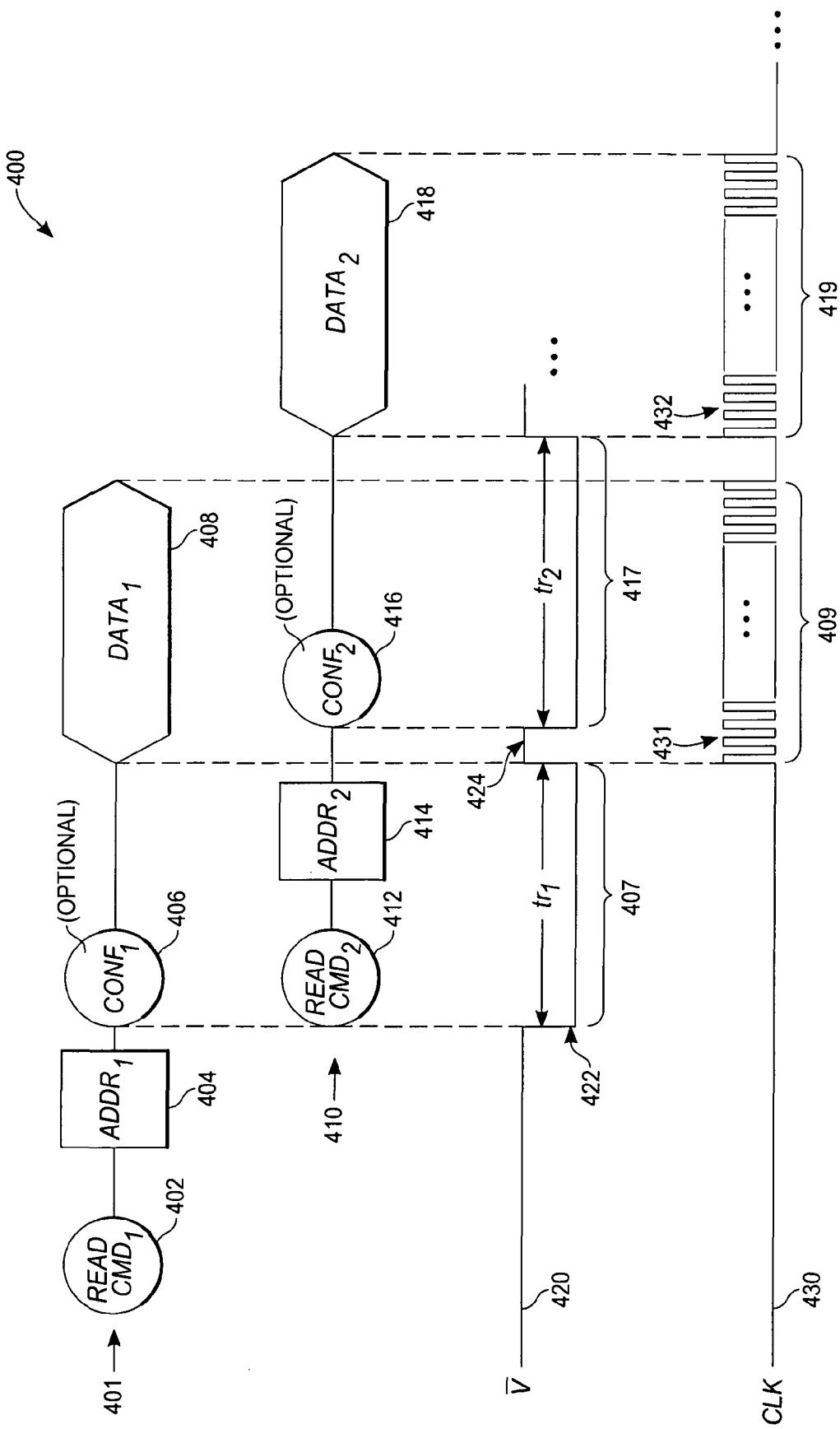
Fig._4

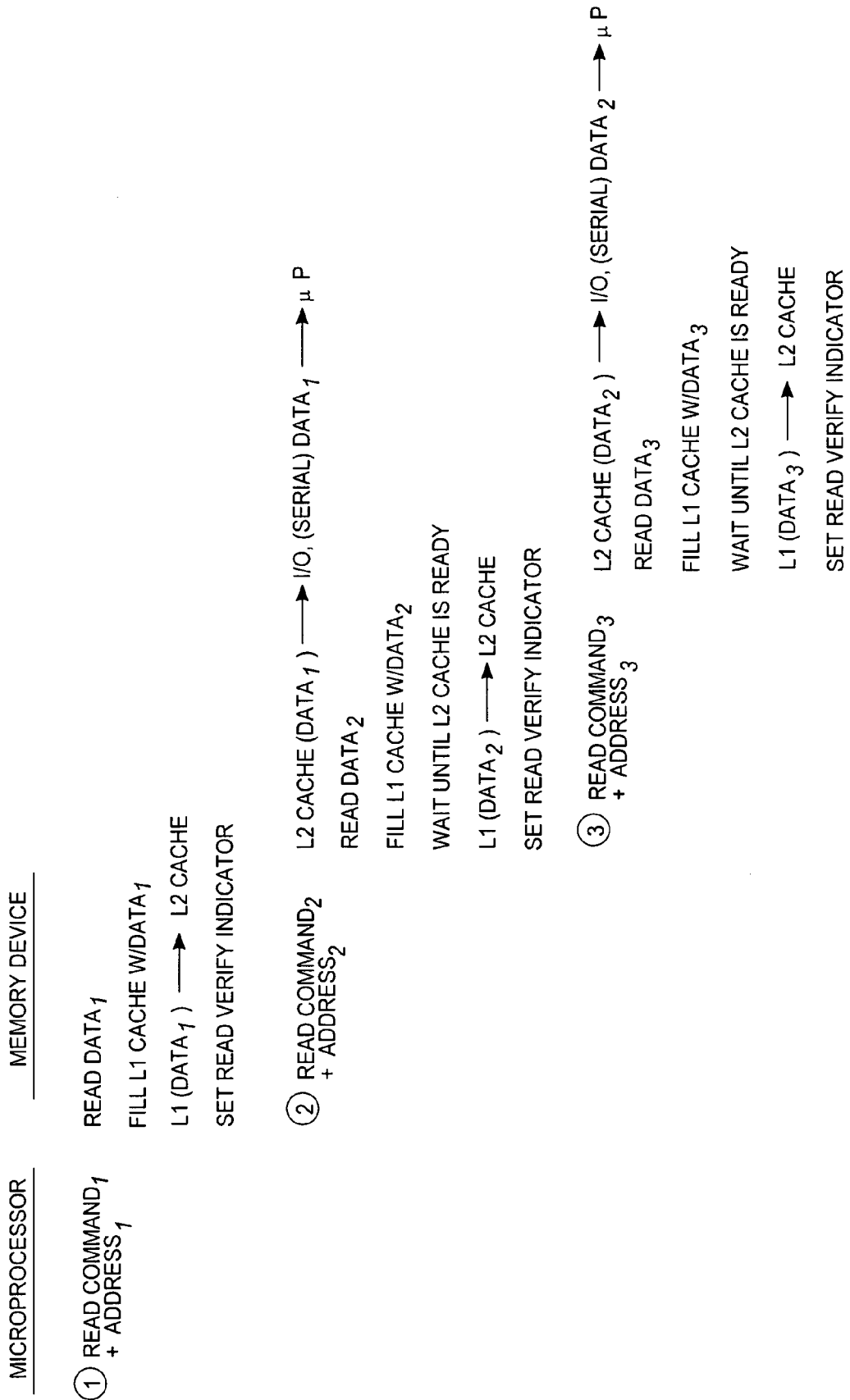
Fig._5

SIMULTANEOUS PIPELINED READ WITH MULTIPLE LEVEL CACHE FOR IMPROVED SYSTEM PERFORMANCE USING FLASH TECHNOLOGY

TECHNICAL FIELD

The present invention relates generally to. nonvolatile memory devices, and more particularly to an improved read protocol for flash or EEPROM devices.

BACKGROUND ART

Typically, a memory device will be coupled to an external control device such as a microprocessor. The microprocessor may be incorporated into a personal computer, a personal digital assistant, a telephone, a camera, or other device requiring a nonvolatile memory. A multitude of devices including PDAs, wireless devices, and cell phones continue to evolve and incorporate new multifunction capabilities. New capabilities include Web access, a digital camera, video, and music storage. To be marketable, these new devices must provide new capabilities at lower costs and in smaller spaces. In addition, nonvolatile memory devices must have higher capacities, improved speed, and improved interface flexibility.

For example, in the cell phone market, previous voice only cell phones utilized approximately 4 to 8 megabytes of memory to store data such as phone numbers, call logs, or messages. Currently, consumers now demand cell phones that are feature-rich. New cell phone devices now include Internet browsing, text messaging, games, Java applications, music, and digital cameras. These exemplary applications have caused an increase in memory requirements. Typically, cell phone manufactures now use 64 to 256 megabytes or more memory to store large amounts of data including pictures and music.

Memory options when designing cell phones are numerous; a conventional memory architecture for a multifunction cell phone may use NOR flash for code storage, PSRAM for workspace, and NAND flash for data storage. Some designers also include SRAM for backup. NAND flash memory currently has the lowest cost per bit, however, NAND flash memory also has a slower random access time compared to other memory types and no capability for byte level programming.

As capacities and costs continue to improve, there are also demands for improved memory performance. U.S. Pat. No. 5,488,711 to Hewitt et al. describes a write cache for reducing the time required to load data into an EEPROM device. A microprocessor may issue a read command to a memory device. Referring to FIG. 1, a typical prior art memory read sequence begins with an external device, such as a microprocessor (not shown), sending a first read command (read $cmd_1$) 302 to a memory device. Following the first read command 302, the microprocessor then sends an address ($addr_1$) 304 for the desired data. Next, there is a read delay (read $delay_1$) 306 and subsequently, upon confirmation that flash is ready with date, the data are serially output ($data_1$) 308 through an input-output circuit to the microprocessor. After the first read sequence has been completed, a second read command (read $cmd_2$) 312 is sent and a second read address ($addr_2$) 314 is sent by the microprocessor to the memory device. After the second read command 312 and address 314 have been sent to the memory device from the microprocessor, there is a second read access delay 316 (read $delay_2$), and serial data output 318 time. A third read command and subsequent steps may follow.

Although the architecture in Hewitt may improve the performance of the memory device, further performance increases using different or improved architectures are possible.

SUMMARY OF THE INVENTION

An exemplary embodiment of the present invention provides an interface or protocol to improve an overall read access time of a nonvolatile memory device having multiple levels of cache. The memory device is configured to output a first plurality of data pages while simultaneously reading a second plurality of data pages.

BRIEF DESCRIPTION OF THE DRAWINGS

FIG. 1 is a prior art diagram of sequential memory device read operations.

FIG. 2 is a block diagram of a memory device containing a cache memory.

FIGS. 3a and 3b are block diagrams of an L1 and L2 cache circuit used for a memory read operation.

FIG. 4 is a block diagram of two interleaved memory device read operations.

FIG. 5 is a diagram of interleaved read operations.

DETAILED DESCRIPTION OF THE INVENTION

Figure 3A:
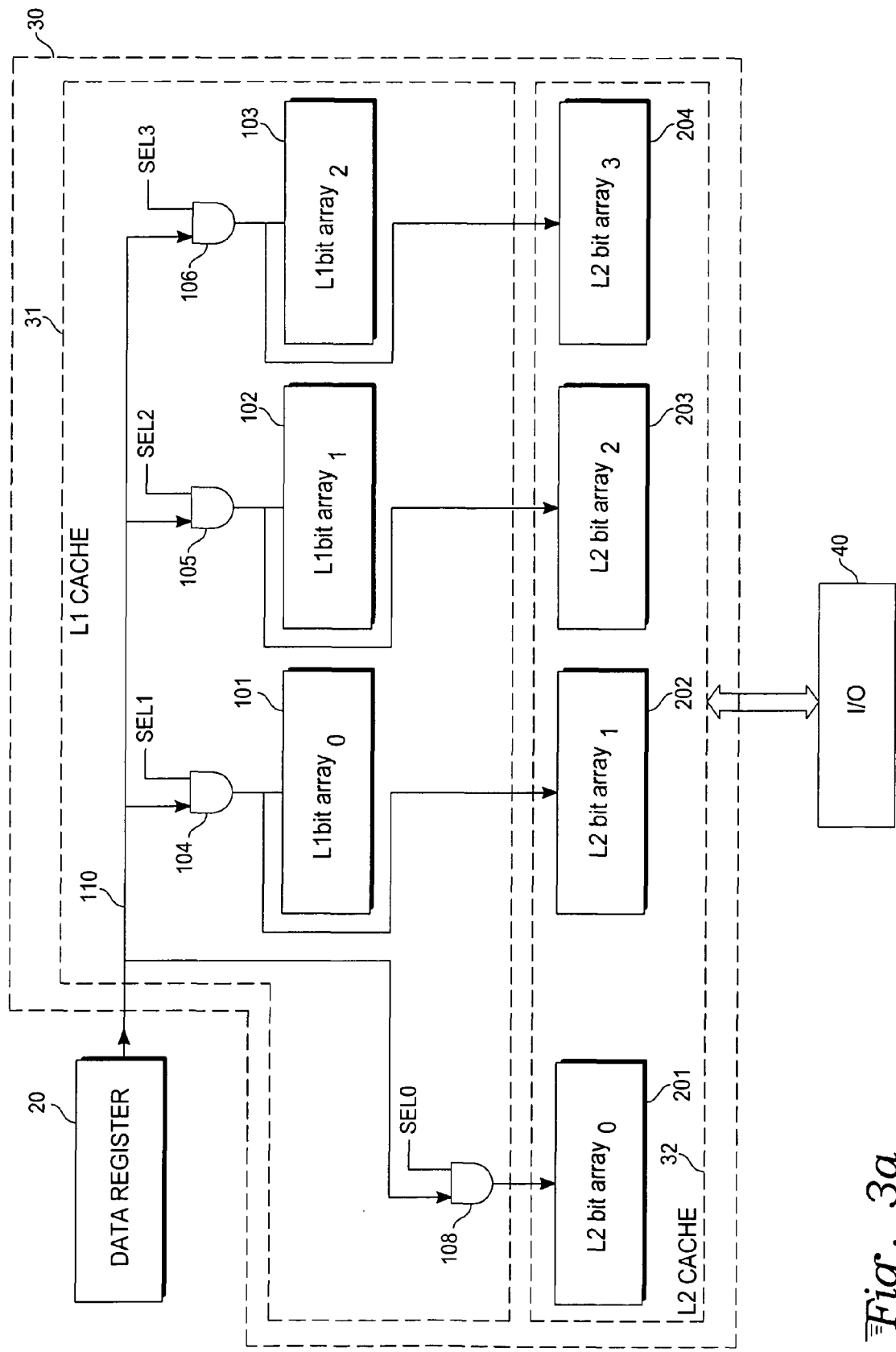

Referring to FIG. 2, an exemplary nonvolatile memory device 100 includes a memory array 10 used to store data, sense amplifiers 11, a data register 20, a cache register 30, an input-output circuit 40, and a control logic circuit 50. The memory array 10 is typically a large capacity NAND flash memory coupled to a large number of sense amplifiers 11 having an ability to present a page of data, for example 528 by 16, in a single read transfer. Alternative page register capacities may be 256 or 264 by 8 or 16, 512 or 528 by 8 or 16, 1024 or 1056 by 8 or 16, 2048 or 2112 by 8 or 16, and 4096 or 4224 by 8 or 16. Stored data or data pages may additionally include extra bits, for example, error correction codes or error correction bits.

The control logic circuit 50 coordinates or controls the data transfer in the memory device. The control logic circuit 50 may be implemented as a state machine or a microcontroller. In an exemplary embodiment, the control logic circuit 50 receives commands from a device that is external to the memory device 100. For example, a read command or a write command may be presented to the memory device 100 followed by an address or address range in the memory array 10. In response, the control logic circuit 50 controls word lines and bit lines coupled to the memory array 10 to address and read data from the memory array 10.

Additionally, the control logic circuit 50 coordinates or controls the transfer of data between the memory array 10 and the data register 20. The control logic circuit 50 also coordinates the transfer or copying of data between the data register 20 and L1 cache 31, the transfer or copying of data between the data register 20 or L1 cache 31 and L2 cache 32, and the control logic circuit 50 coordinates the transfer or copying of data between the L2 cache 32 and the input-output circuit 40. In an exemplary embodiment, the input-output circuit 40 contains a pipeline register.

During a read operation, data stored in the memory array 10 are transferred to the data register 20 via the sense amplifiers 11. The data register 20 is selectively coupled to the first level of L1 cache 31 and data temporarily stored in the data register 20 are copied to a selected portion of the L1 cache 31. Data continue to be read from the memory array 10 into the data register 20 and copied into the L1 cache 31 until the L1 cache 31 has been filled with data. Data stored in the L1 cache 31 are then copied to the L2 cache 32. Portions of the data stored in the L2 cache 32 are transferred or copied to the input-output circuit 40. The input-output circuit 40 then serially outputs the data, while the next read cycle is simultaneously being performed by the data register 20 and the L1 cache 31.

Continuing with FIG. 2, the memory device 100 responds to a read or a write command provided by an external device such as a microprocessor. A protocol, or command user interface, linking a memory device to the microprocessor is incorporated in a function of the control logic 50 in the memory device 100. For example, the instruction code is an 8-bit instruction or command followed by an appropriate address based on memory array size, for example, a 32 bit address. The microprocessor may additionally issue a confirm command to a memory device 100 by passing a command code confirm of 30 (hex) to the memory device 100. The address of the data, for example, is the beginning address of a single page of data or the beginning address of multiple pages of data. The memory device 100 then provides the requested data to the microprocessor. In an exemplary embodiment, the memory device 100 issues a 16 bit parallel word, toggling each bit serially to provide a page of data to the microprocessor. In another example, a read command followed by a 32 bit address, followed by a confirmation command or confirmation byte, is sent to the memory device 100 by the microprocessor. The data located at the requested address are retrieved from the memory device memory array 10 (FIG. 2) and sent to the microprocessor. A time delay between the presentation of a read command to the memory device 100 and the time when the data are available and sent to the microprocessor is typically referred to as a read access time.

Referring to FIG. 3a, an exemplary embodiment of a data register 20, cache register 30, and I/O circuit 40 (FIG. 2) is shown. The data register 20 has a capacity to store a single page of data from the memory array 10 (not shown in FIG. 3a). Both the L1 cache 31 and L2 cache 32 have the capacity to store multiple pages of data from the data register 20.

During a read operation, typically controlled by the control logic 50 (in FIG. 2), a page of data is read from the memory array 10 into the data register 20 and the data register page is copied to one of a plurality of L1 bit arrays 101, 102, 103 using a plurality of select devices 104, 105, 106. In an exemplary embodiment, a first page of data is read into the data register 20 and the data values are presented on a data bus 110. At least one of the select devices 104, 105, 106 couples the data bus 110 to a selected L1 bit array 101, 102, 103. For example, the select device 106 is activated coupling the data bus 110 to the L1 bit array$_2$ 103. The data register page is then copied to the L1 bit array$_2$ 103. At the same time, the select device$_2$ 105 and the select device$_1$ 104 do not actively couple the data bus 110 to the L1 bit array$_1$ 102 or to the L1 bit array$_0$ 101.

After the first data register page has been copied from the data register 20 to the L1 bit array$_2$ 103, the data register page is overwritten by a second page of data from the memory array 10. Pages of data continue to be read from the memory array 10 into the data register 20 until all of the L1 bit arrays 101, 102, 103 have had data copied to them and the L1 cache 31 is full of data. The second and third data register pages are copied from the data register 20 into the L1 bit array$_1$ 102 and the L1 bit array$_0$ 101. When the L1 bit arrays 101, 102, 103 are full of data, another read operation is performed and a page of data is read from the memory array 10 into the data register 20. In another embodiment, a data register page may be copied to any single selected L1 bit array 101, 102, 103 or copied to a plurality of L1 bit arrays. In an alternative embodiment, the first data register page is copied from the data register 20 directly to a single selected L2 bit array 201, 202, 203, 204 or copied from the data register 20 to a plurality of bit arrays in the L2 cache 32.

The data in the data register 20 and in the L1 cache 31 are then copied into the corresponding L2 bit arrays 201, 202, 203, 204. The page of data in the data register 20 is copied to the L2 bit array$_0$ 201 via the select device$_0$ 108, and the L1 bit arrays 101, 102, 103 are copied to the corresponding L2 bit arrays 202, 203, 204 in a single cycle. The data in the L2 cache 32 are then copied to an input-output circuit 40. The input-output circuit 40 then serially outputs the stored data, for example on a pin or line of the memory device 100, bit-by-bit to an external device such as a microprocessor (not shown).

In an exemplary embodiment, an entire page (four data register pages) of data is output word-by-word. A plurality of lines may provide multiple bits of data in parallel where the data are output with each line of the word providing a serial stream of data bits to an external device (not shown). For example, a 16-bit word of data is presented on 16 lines and each bit of the 16-bit word provides a serial stream of data so that an exemplary page of data at 528 by 16 is output to the microprocessor. In another example, the data in the input-output circuit 40 are presented to an external device as a 64-bit word (64 bits in parallel), serially clocking each bit of the 64-bit word for 264 cycles to present the entire page of data to the external device or microprocessor. Alternatively, any number of bits in parallel may be presented to an external device. Additionally, in other embodiments, the data lines may include additional bits such as error-checking codes or error correction bits.

Referring still to FIG. 3a, a read access time for a single data register page of data includes the time to read data from the memory array 10, and load the data into the data register 20 and the L1 cache 31. In an exemplary embodiment, multiple data register pages are loaded into an L1 cache 31, increasing the total read access time. Having an L1 cache 31 that contains multiple L1 bit arrays 101, 102, 103, each capable of containing a data register page of data, requires a page register of data to be copied three times to corresponding L1 bit arrays 101, 102, 103 to fill the L1 cache. In one example, with a read delay time of 25 microseconds for each data register read cycle, the total read access time is approximately 75 microseconds for three data register page reads that are selectively copied to the corresponding L1 cache bit arrays 101, 102, 103, and another 20 microseconds (because there is no data transfer to a cache) for a fourth read operation to fill the data register 20. Since three data pages from the L1 cache 31 and one page from the data register are needed to fill four L2 bit arrays 201, 202, 203, 204, the total read access time for this example is approximately 80 microseconds (assuming the data transfer time from the L1 cache 31 to the L2 cache 32, and the transfer time from the data register 20 to the L1 cache are each 5 microseconds).

An exemplary read sequence of FIG. 3b includes accessing a page of data in a memory array 10 (in FIG. 2) and copying 510 the data to a data register 20. Next, the page of data in the data register 20 is copied 520 to an L1 cache 31. A determination 530 is made whether the L1 cache is full. If the L1 cache 31 is not full, another page of data in the memory array 10 is accessed and copied 510 to the data register 20, and a new page of data is copied 520 from the data register 20 to the L1 cache 31. If the L1 cache 31 is full, another page of data in the memory array 10 is accessed and copied 540 to the data register 20. When the L1 cache 31 and the data register 20 are full of data, a determination 550 is made whether the L2 cache 32 is available. If the L2 cache 32 is not available, data in the L1 cache 31 and the data in the data register 20 are held, and in one embodiment, a predetermined wait period is executed 560 or alternatively, a "no op" instruction is performed until the L2 cache 32 is available. When the L2 cache 32 is available, data in the L1 cache 31 and data in the data register 20 are copied 570 into the L2 cache 32. Data in the L2 cache 32 are then copied 580 to the input-output circuit 40. Data read operations 510, 520, 530, 540 involving the data register 20 and L1 cache 31 are performed while the I/O circuit simultaneously outputs the data to the microprocessor.

Referring to FIG. 4, in one embodiment, a memory read protocol 400 begins with an external device, such as a microprocessor (not shown), executing a first read sequence 401 by sending a first read command (read $cmd_1$) 402 and then sending a first memory (or data) address ($addr_1$) 404 for the desired data to a memory device 100 (see FIG. 2). Optionally, a first read confirmation indicator ($conf_1$) 406 may be provided by the microprocessor. Alternatively, memory device 100 provides a verification indicator 422 on a verification line ($\bar{V}$) 420 or the second read command may initiate at 424 after the cache 30 (in FIG. 2) is full. Also, a verification line may be implemented as a ready or busy line, for example, as a rdy/bsy line. In one example, depending on the memory array size, the time to send a read command sequence, which includes a read command 402 (8-bits), a data address 404 (32 bits), and confirmation command 406, is 6 clock cycles. For this example, when each clock cycle time is 50 ns, it takes 300 ns to send a read command sequence.

In one embodiment, after the memory device 100 has received a read command 402 and address 404, the memory device verification line $\bar{V}$ 420 is used as an indicator to confirm to the microprocessor that a read command sequence has been received, and a read operation is being executed by the memory device 100. Also, $\bar{V}$ may be implemented as a Rdy/bsy signal. For example, the verification line $\bar{V}$ 420 is normally high and is brought to a low state 422 during a read access time ($tr_1$) 407. The verification line $\bar{V}$ 420 indicates that the memory array is being read but the data at the requested address is not yet available or stable. Typically, a read delay time, to read from a memory array 10 into a data register 20 (for a single page of data) is in the range of 12 to 25 microseconds. With two levels of cache (L1 31 and L2 32 in FIGS. 2 and 3a), the overall read access time is improved by interleaving a first data output operation (via the memory device I/O circuitry) with a subsequent data read operation. Referring still to FIG. 4, the memory device 100 verification line $\bar{V}$ 420, brought to a low state 422, may be used as an indicator that the L1 cache 31 (in FIG. 2) is free and the memory device 100 is ready to receive another (second) read command 412 from the microprocessor. In an alternate embodiment, a separate line or indictor is used to signal the microprocessor that the memory device 100 is ready to receive another read command. The interleaving operation serially outputs data ($data_1$) 408 from a first read command sequence 401 while simultaneously performing a second read operation. The second read operation has a read delay time ($tr_2$) 417 in response to the second read command (read $cmd_2$) 412 and second data address ($addr_2$) 414 (and/or confirmation command ($conf_2$) 416).

When the verification line $\bar{V}$ 420 is brought to a high state 424, a first requested page or pages of data have been read from the memory array 10 and the data page(s) are available for output from the memory device to the microprocessor. In one embodiment, $\bar{V}$ may be used as an indicator that the second read command 412 may be sent. In an alternate embodiment, after the memory device verification line $\bar{V}$ 420 is inverted, a delay is required before the microprocessor may send another command. For example, after the verification line 420 is inverted 422, the microprocessor must execute a no-op command or a predetermined delay before sending another read command 412. The second read command (read $cmd_2$) 412 and a second read address ($addr_2$) 414 is then sent by the microprocessor to the memory device. Optionally, a second confirmation command ($conf_2$) 416 may be sent either by the microprocessor or the memory device 100. The data ($data_1$) 408 from the first read command is sent to the microprocessor and simultaneously, a second read operation having a read delay time ($tr_2$) 412 is performed by the memory device 100 responding to a second or subsequent read command (read $cmd_2$) 412.

Data located at the first address ($addr_1$) 404, from the first read command (read $cmd_1$) 402, is serially output ($data_1$) 408 through an input-output circuit (I/O) 40 (see FIG. 2) by the memory device 100 to the microprocessor. For example, the serial data ($data_1$) 408 is sent by the input-output circuit 40 on each line or pin of an 8 bit or 16 bit word to the microprocessor using a read clock or data clock 430 that toggles or validates the serial data bits. In one embodiment, a data clock line 430 from the memory device 100 provides a clock signal 431 that indicates when each bit in the first serial data ($data_1$) 408 stream is valid or stable. Exemplary data clock pulses 431 clock the serial data from the memory device for a predetermined duration 409 of data clock cycles for a first data output ($data_1$) 408 and second data output ($data_2$) 418. In alternate embodiments, a data clock line 430 is provided by either an external device such as the microprocessor or by a dedicated circuit.

For an exemplary 4 pages of data totaling 2112 by 8, a memory device 100 having 8 parallel data lines and each data line serially outputs 2112 bits, and using a 50 ns clock cycle, the time it takes to provide 4 pages of data from the memory device 100 to the microprocessor is approximately 105.6 microseconds. In comparison, the total time it takes to send a read command sequence and access (read) the data 407 is approximately 100 microseconds.

Using the above examples, the time that the first serial data ($data_1$) 408 takes to be clocked from the memory device 100 to the microprocessor is approximately 114 microseconds, and a total read delay time ($tr_2$) 417 (time to read the required number of pages from the memory array 20) responding to the second read command (read $cmd_2$) 412 is approximately 100 microseconds. The overall read access time is improved for the second read command by interleaving the operation that serially outputs data ($data_1$) 408 from the first read command (read $cmd_1$) 402 with a second or subsequent read operation 410. Overlapping the data output period ($data_1$) 408, for a predetermined duration 409 of data clock cycles 431, from a first read command (read $cmd_1$) 402, and interleaving a read delay time ($tr_2$) 417 from a second read sequence 410, saves (or will adjust approximately) 40% of the overall time of the second read operation 410 when compared to the read sequence of FIG. 1. Referring again to FIG. 4, interleaving subsequent read operations, for example third and fourth read operations, will provide similar performance benefits per each read operation. Since there are two data caches, we are able to isolate both operations of memory and microprocessor requests.

Referring to FIG. 5, an exemplary set of operations by an external device or microprocessor and the memory device 100 are shown. A first read command and first address are sent from a microprocessor to a memory device. The memory device 100 responds by reading a first portion of requested data (data$_1$) from a memory array 10 into a data register 20. The first portion of requested data (data$_1$) is then copied to a first level (L1) of cache 31, for example, taking three data register read operation cycles to fill the L1 cache 31. When the L1 cache 31 has been filled with data, another portion of the requested data (data$_1$) is read into the data register 20. The requested data (data$_1$) in the data register 20 and in the L1 cache 31 is then copied to a second level (L2) of cache 32 in a single clock cycle. A read verify indicator is asserted, indicating that the memory device is retrieving data from the memory array in response to the first read command from the microprocessor.

The read verify indicator may be used by the memory device 100 or the microprocessor as a check to assure that the L1 or first level of cache 31 is available for a subsequent read operation and that the memory device 100 is set to begin sending data from the previous read operation. A microprocessor may check the read verify indicator before sending a subsequent read command. The microprocessor then sends a second read command and second address while data (data$_1$) from the first read command are simultaneously being serially sent to the microprocessor. The memory device 100 (see FIG. 2) responds to the second read command by reading a portion of the second requested data (data$_2$) from the memory array 10 into the data register 20 while simultaneously continuing to copying the first requested data (data$_1$) from the L2 cache into the I/O circuit 40 and toggling a serial read clock to output the first requested data (data$_1$) to the microprocessor. Simultaneously, portions of the second requested data (data$_2$) are copied from the data register 20 to fill the L1 cache 31. After the L1 cache 31 has been filled, and the data register 20 has been filled with a portion of the second requested data (data$_2$), the memory device will wait until the first requested data (data$_1$) in the L2 cache 32 has been fully copied to the I/O circuit 40. When the L2 cache 32 is ready, the second requested data (data$_2$) that is in the data register 20 and the L1 cache 31 will be copied to the L2 cache 32. The interleaving operation using an internal cache 30 that stores two levels of requested data (data$_1$, data$_2$), simultaneously sending data from a first or previous read command and performing a read operation for a second or current read command.

In alternate embodiments, an auto-increment function is employed so that a second address is not required from a device requesting data from the memory device. The auto-increment function may be invoked by a variety of methods, including but not limited to: 1) supporting an auto increment command where the first or second read command is command code that invokes an auto-increment using the last memory address sent to the memory array, 2) a line or signal (pin) to the memory device having a logic indicator that the auto-increment function should be used or turned on, or 3) an optional confirmation command that indicates that an auto-increment function is to be used for the next or current address. After a plurality of data pages are copied into a cache 30 (in FIG. 2), a second interleaved read operation using an incremented address, a second fixed address, or another predetermined address (for example from the memory array 10), is executed.

Figure 6:
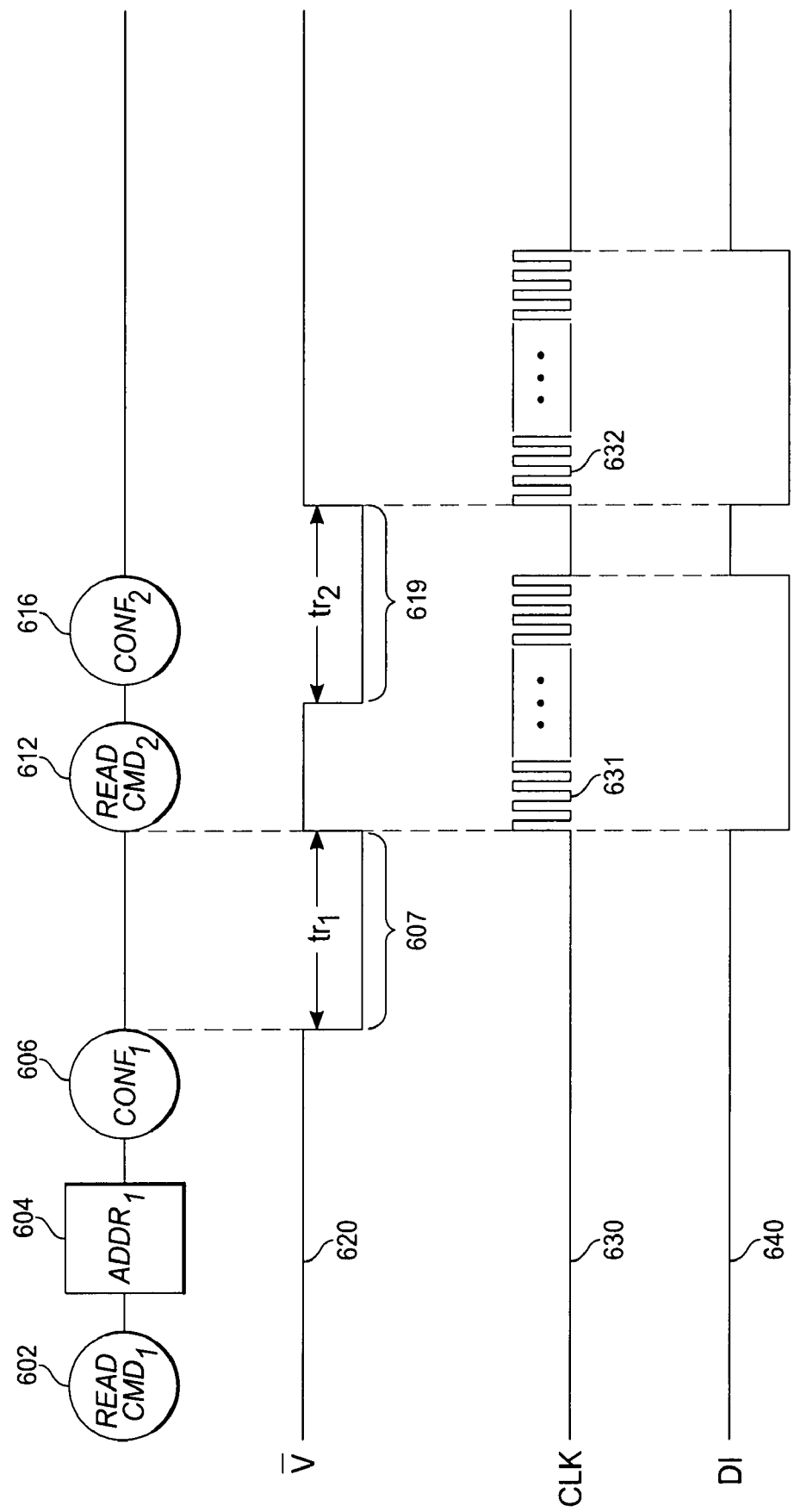
FIG. 6 is a block signal timing diagram of another embodiment of sequential memory device read operations according to the present invention.

Referring to FIG. 6, in one embodiment a first read command (read cmd$_1$) 602 is sent to a memory device, followed by a first memory (or data) address (addr$_1$) 604. Optionally, a first confirmation indicator (conf$_1$) 606 may also be sent. Alternatively, memory device 100 provides a verification indicator ($\bar{V}$) 620 for time period tr$_1$ 607 indicating that a first read operation is being executed by the memory device 100 (in FIG. 2) but data at the first address is not yet available or stable. When the data is available, the verification indicator 620 is inverted and data located at the first address is serially output through an input output circuit (I/O) 40 and the memory device is ready to execute a second read command (read cmd$_2$) 612 and/or a second confirmation command (conf$_2$) 616. For example, a data clock line 630 from the memory device 100 provides a clock signal 631 that indicates when each bit in a serial data stream is valid or stable. Alternatively, a data indicator (DI) line may be inverted to indicate that a serial data stream is provided by the memory device 100.

During the time that data located at the first memory address is serially output by the memory device 100, the memory device 100 increments the first memory address to generate a second memory address. In one example, the memory device increments the first memory address in response to receiving a second read command 612 and/or a second confirmation command 616. In a second example, the memory device 100 increments the first memory address in response to a logical line, pin, or connection that signals that an auto-increment function should be performed. In another example, the memory device 100 automatically increments the first memory address automatically without receiving a second read command or signal.

A second read operation is performed using the incremented or second memory address during the time that data located at the first memory address is serially output by the memory device during time period tr$_2$ 619. After all the data located at the first memory address is serially output, and the second read operation has been performed, data from the second memory address is serially outputted by the memory device 100. In one embodiment, the data clock line 630 provides a clock signal 632 that indicates when each bit in a serial data stream is valid or stable. In alternate embodiments, a ready indicator or a delay may be required before the data is copied or transferred.

In another embodiment, a memory device read command is automatically executed by a memory device 100 at power up, boot up, or on reset using a predetermined or fixed address. Data now stored in the cache 30 is then copied or transferred to a microprocessor or copied or transferred to a second memory device such as a volatile memory device, while a second read operation is being performed using a second predetermined memory address or an automatically incremented address. In an alternate embodiment, a ready indicator or a delay may be required before the data is copied or transferred.

Those of skill in the art will recognize that the invention can be practiced with modification and alteration within the spirit and scope of the appended claims and many other embodiments will be apparent to those of skill in the art upon reading an understanding the above description. The description is thus to be regarded as illustrative instead of limiting. The scope of the invention should, therefore, be determined with reference to the appended claims, along with the full scope of equivalents to which said claims are entitled.

What is claimed is

1. A command protocol method for a nonvolatile memory device, the command protocol method comprising:
    sending a first read command for one or more first pages of data to said nonvolatile memory device;
    sending a first data address to said nonvolatile memory device, said nonvolatile memory device reading one or more first pages of data in accord with said first read command beginning at said first data address and loading said one or more first pages of data one page at a time from a memory array within said nonvolatile memory device into a data register that transfers the one or more first pages of data into a first level of a cache memory of said nonvolatile memory device with multiple page capacity, said cache memory having multiple levels within said nonvolatile memory device, said cache memory being separate from said data register, said data register having a capacity to store a single page of data, said data register and said cache memory controlled by control logic within said nonvolatile memory device such that said control logic controls the reading;

transferring the one or more first pages of data from the first level of the cache memory to a second level of the cache memory;

sending a second read command for one or more second pages of data to said nonvolatile memory device before receiving an entirety of the first pages of data located beginning at said first data address; and sending a second data address to said nonvolatile memory device before receiving the entirety of first pages of data located beginning at said first data address, the nonvolatile memory device reading one or more second pages of data in accord with the second read command beginning at said second data address and loading the one or more second pages of data one page at a time via the data register into said first level of said cache memory while simultaneously outputting the one or more first pages of data from the second level of said cache memory to an input-output circuit within said nonvolatile memory device.

2. The command protocol method of claim 1 wherein the command protocol is executed by a microprocessor coupled to said nonvolatile memory device.

3. The command protocol method of claim 1 wherein a first confirmation indicator is sent to said nonvolatile memory device after sending said first read command and sending said first data address.

4. The command protocol method of claim 1 wherein a first confirmation indicator is sent from said nonvolatile memory device in response to receiving said first read command and said first data address.

5. The command protocol method of claim 1 wherein a second confirmation indicator is sent to said nonvolatile memory device after sending said second read command and sending said second data address.

6. The command protocol method of claim 1 wherein a second confirmation indicator is sent from said nonvolatile memory device in response to receiving said second read command and said second data address.

7. The command protocol method of claim 1 wherein portions of said entirety of data located at said first data address is being received while said nonvolatile memory device is simultaneously reading data located at said second data address.

8. The method of claim 1, wherein the method includes transferring said one or more first pages of data loaded into a plurality of bit arrays of said first level of said cache memory to a plurality of bit arrays of said second level of said cache memory.

9. A method of reading from a nonvolatile memory device, the method comprising:

receiving, at the nonvolatile memory device, a first read command and a first memory address from a microprocessor coupled to said nonvolatile memory device;

setting a read verification indicator in response to said first read command;

reading a first plurality of data pages from a memory array one page at a time into a data register, said data register located within said nonvolatile memory device, said data register having a capacity to store a single page of data, said nonvolatile memory device having a cache memory within said nonvolatile memory device, said cache memory being separate from said data register, said data register and cache memory controlled by control logic within said nonvolatile memory device such that said control logic controls the reading;

copying said first plurality of data pages from said data register, as each page is read from said memory array, into a first level cache of said cache memory within said nonvolatile memory device, said cache memory having multiple page capacity and having multiple level caches within said nonvolatile memory device;

transferring the first plurality of data pages from the first level cache of said cache memory to a second level cache of said cache memory;

receiving, at the nonvolatile memory device, a second read command and second memory address from the microprocessor;

setting said read verification indicator in response to said second read command; and outputting said first plurality of data pages from the second level cache of said cache memory to an input-output circuit within said nonvolatile memory device to the microprocessor while simultaneously reading a second plurality of data pages from said memory array one page at a time into said data register and copying said second plurality of data pages into said first level cache as each page is read from said memory array.

10. The method of claim 9 wherein said first level cache and said second level cache both include multiple page capacity.

11. The method of claim 9 wherein said first plurality of data pages are read from said memory array and copied to said first level cache, then subsequently copied to said second level cache after checking availability of said second level cache.

12. The method of claim 9 wherein said read verification indicator is a read verification line driven by said nonvolatile memory device.

13. The method of claim 9 wherein a third read command and third memory address are received, said read verification indicator is inverted, and said second plurality of data pages is outputted while simultaneously reading and storing a third plurality of data pages from said memory array.

14. The method of claim 9 further comprising:

receiving a third read command and third memory address;

setting said read verification indicator in response to said third read command; and outputting said second plurality of data pages while simultaneously reading and storing a third plurality of data pages from said memory array.

15. The method of claim 9, wherein copying said first plurality of data pages from said data register into said first level cache includes copying said first plurality of data pages from said data register into said first level cache with said first level cache arranged as a plurality of first level bit arrays.

16. The method of claim 15, wherein copying said first plurality of data pages from said data register into said first level cache includes selecting one of said first level bit arrays and copying a portion of first plurality of data pages into said selected first level bit array with other first level bit arrays not selected to receive data while copying said portion into said selected first level bit array.

17. A method of reading from a nonvolatile memory device, the method comprising:
  reading at least one page of data from a nonvolatile memory array automatically one page at a time into a page register, the page register within said nonvolatile memory device, said nonvolatile memory device having a multi-page cache memory within said nonvolatile memory device, said multi-page cache memory being separate from said page register, said page register having a capacity to store a single page of data, said page register and multi-page cache memory controlled by control logic within said nonvolatile memory device such that said control logic controls the reading;
  copying said at least one page of data one page at a time from said page register to a first level cache of said multi-page cache memory of said nonvolatile memory device;
  transferring the at least one page data from said first level cache of said multi-page ache memory to a second level cache of said multi-page cache memory;
  copying a plurality of bits from said at least one page of data between the second level cache of said multi-page cache memory and an input-output circuit; and
  outputting, to an input-output circuit of said nonvolatile memory device, at least one bit of said plurality of bits from said at least one page of data and simultaneously reading at least one other page of data from said nonvolatile memory array automatically via said page register, into said first level cache of said multi-page cache memory.

18. The method of claim 17 wherein said first level cache and said second level cache both include multiple bit arrays.

19. The method of claim 17 wherein said at least one page of data are read from said memory array and copied to said first level cache, then subsequently copied to said second level cache after checking availability of said second level cache.

20. The method of claim 17 wherein reading at least one page of data automatically occurs during a boot-up process or during a reset process.

21. The method of claim 17 wherein said one page of data is stored at a predetermined memory address.

22. The method of claim 21 wherein a second predetermined memory address is used to simultaneously read said at least one other page of data.

23. The method of claim 21 wherein said predetermined memory address is incremented to simultaneously read said at least one other page of data.

24. The method of claim 17 wherein said input-output circuit is coupled to a volatile memory device and said plurality of bits are sent to said volatile memory device.

25. The method of claim 24 wherein said volatile memory device provides a ready indicator before said plurality of bits are sent to said volatile memory device.

26. The method of claim 17 wherein said input-output circuit is coupled to a microprocessor and said plurality of bits are sent to said microprocessor.

27. The method of claim 26 wherein said microprocessor provides a ready indicator before said plurality of bits are sent to said microprocessor.

28. The method of claim 17, wherein copying said at least one page of data from said page register to said first level cache includes copying said at least one page of data from said page register to said first level cache with said first level cache arranged as a plurality of first level bit arrays.

29. The method of claim 28, wherein copying said at least one page of data from said page register to said first level cache includes selecting one of said first level bit arrays and copying a portion of said at least one page of data into said selected first level bit array with other first level bit arrays not selected to receive data while copying said portion into said selected first level bit array.

* * * * *

UNITED STATES PATENT AND TRADEMARK OFFICE
CERTIFICATE OF CORRECTION

PATENT NO.       : 7,877,566 B2          Page 1 of 1
APPLICATION NO.  : 11/043277
DATED            : January 25, 2011
INVENTOR(S)      : Vijaya P. Adusumilli It is certified that error appears in the above-identified patent and that said Letters Patent is hereby corrected as shown below:

In column 11, line 19, in Claim 17, delete "ache" and insert -- cache --, therefor.

Signed and Sealed this
Fifteenth Day of March, 2011

David J. Kappos
*Director of the United States Patent and Trademark Office*